(12) United States Patent
Thorne

(10) Patent No.: US 8,560,907 B1
(45) Date of Patent: Oct. 15, 2013

(54) DEBUGGING EXTERNAL INTERFACE

(75) Inventor: Neil Kenneth Thorne, London (GB)

(73) Assignee: Altera Corporation, San Jose, CA (US)

( * ) Notice: Subject to any disclaimer, the term of this patent is extended or adjusted under 35 U.S.C. 154(b) by 411 days.

(21) Appl. No.: 12/190,573

(22) Filed: Aug. 12, 2008

Related U.S. Application Data

(60) Provisional application No. 60/970,405, filed on Sep. 6, 2007.

(51) Int. Cl.
*G01R 31/30* (2006.01)
*G06F 11/00* (2006.01)

(52) U.S. Cl.
USPC .......................... 714/745; 714/700

(58) Field of Classification Search
USPC .............. 714/718, 723, 725, 700, 745
See application file for complete search history.

(56) References Cited

U.S. PATENT DOCUMENTS

| | | | | |
|---|---|---|---|---|
| 5,113,451 A | * | 5/1992 | Chapman et al. | 382/145 |
| 5,260,950 A | * | 11/1993 | Simpson et al. | 714/727 |
| 5,412,753 A | * | 5/1995 | Alston et al. | 706/11 |
| 5,497,458 A | * | 3/1996 | Finch et al. | 714/30 |
| 5,566,339 A | * | 10/1996 | Perholtz et al. | 713/340 |
| 5,774,647 A | * | 6/1998 | Raynham et al. | 714/48 |
| 5,870,404 A | * | 2/1999 | Ferraiolo et al. | 714/700 |
| 5,959,914 A | * | 9/1999 | Gates et al. | 365/201 |
| 6,061,282 A | * | 5/2000 | Tamaki | 365/201 |
| 6,304,502 B1 | * | 10/2001 | Watanabe et al. | 365/201 |
| 6,681,353 B1 | * | 1/2004 | Barrow | 714/725 |
| 6,693,816 B2 | * | 2/2004 | Brunelle et al. | 365/63 |
| 6,973,405 B1 | * | 12/2005 | Ansari | 702/117 |
| 6,996,032 B2 | * | 2/2006 | Ganry | 368/118 |
| 7,333,908 B2 | * | 2/2008 | Johnson | 702/120 |
| 7,458,000 B2 | * | 11/2008 | Gorman et al. | 714/733 |
| 7,571,357 B2 | * | 8/2009 | Brittain et al. | 714/42 |
| 2007/0101214 A1 | * | 5/2007 | Stauffer et al. | 714/724 |
| 2007/0192754 A1 | * | 8/2007 | Hofsaess | 716/5 |

* cited by examiner

*Primary Examiner* — Steve Nguyen
(74) *Attorney, Agent, or Firm* — Ropes & Gray LLP

(57) ABSTRACT

A memory controller has a first interface, for connection to an external memory device; a second interface, for connection to at least one other component; and a third JTAG interface, for connection to an external user device. The memory controller further includes a processor, which performs calibration processes, in order to synchronize operations of the memory controller and the external memory device, and also runs test software for testing operation of the first interface and the external memory device, and for providing test results to the external user device over the third interface. The memory controller further includes an internal memory, for storing the instructions defining the test software.

14 Claims, 2 Drawing Sheets

DEBUGGING EXTERNAL INTERFACE

CROSS-REFERENCES TO RELATED APPLICATIONS

This application claims the benefit of U.S. provisional patent application No. 60/970,405, titled DEBUGGING EXTERNAL INTERFACE, by Thorne, filed Sep. 6, 2007, which is hereby incorporated by reference.

BACKGROUND

This invention relates to a method and a system for testing the operation of an electronic device. In particular, the invention relates to a method and a system for testing the operation of an interface between the electronic device and a separate device.

SUMMARY

One of the most important stages in the design and release of a new electronic product is the testing stage. Although the different components of the product may operate perfectly satisfactorily in isolation, it is still necessary to test the overall operation of the product when its various components are put together.

For example, in the case of component devices implemented in Field Programmable Gate Arrays (FPGAs), software can be provided, that receives as its input the intended characteristics of the device, and then generates the configuration data required to implement the design in the FPGA. This system can operate with a high degree of reliability to produce devices that work satisfactorily.

However, when such devices are to be used in products together with other electronic devices, it is also necessary to test the operation of the devices in combination with the other electronic devices. This can be time-consuming, particularly where the interface between the FPGA device and the other device is a high speed interface, carrying signals that have an analog character as well as a digital character, in the sense that the timing of their transitions from digital "high" values to "low" values is important.

This is the case, for example, where the other electronic device is an external memory device, and in particular a high data rate memory device, such as a DDR (or DDR2) SDRAM (double-data-rate synchronous dynamic random access memory).

DESCRIPTION OF EXEMPLARY EMBODIMENTS

Figure 1:
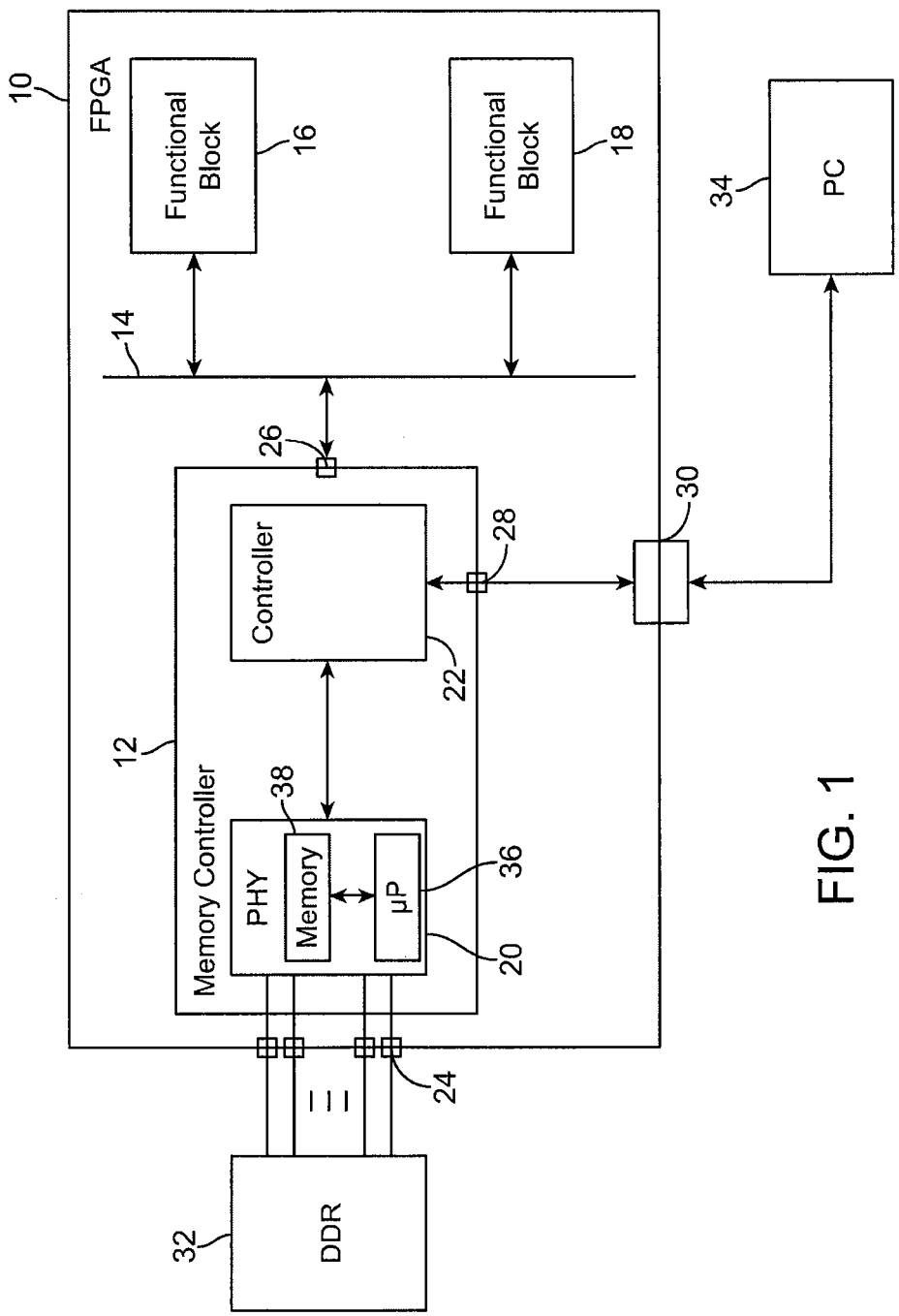
FIG. 1 is a block schematic diagram, illustrating an electronic device in accordance with the present invention.

FIG. 1 is a block schematic diagram, illustrating an electronic device 10, in the form of a Field Programmable Gate Array (FPGA). As is well known such devices include an array of logic elements, and the functions and interconnections of these logic elements are determined by configuration data which is applied to the device. The configuration data can therefore cause the device to perform relatively complex functions. As shown in FIG. 1, it can be helpful to consider the configured device as containing a number of interconnected functional blocks, although such a representation need not accurately represent the arrangement of the logic elements that perform these functions.

In order to allow users of FPGAs to implement desired functionality in the devices, design software can be provided. The design software can present the user with a list of functional blocks available for selection, and can also present the user with a list of configurable parameters for each of the selected functional blocks. The design software can then allocate the selected functional blocks to the available logic resources on the device, and can generate the configuration data, which, when applied to the device, causes the desired functionality to be implemented in the device.

FIG. 1 shows, for the purposes of illustration of the present invention, an FPGA 10, in which have been implemented a memory controller 12, a bus 14, and two other functional blocks, namely a first functional block 16 and a second functional block 18, each having a connection to the bus 14. It will be apparent to the person skilled in the art that the bus 14 can take any suitable form, that the illustrated first and second functional blocks 16, 18 can perform any desired function, and moreover that more than two such functional blocks can be provided.

As is generally conventional, the memory controller 12 can be considered as comprising a physical interface (PHY) block 20 and a controller block 22. Again, as is conventional, the PHY block, for example, translates signals between different time domains, while the controller block 22 performs cycle-by-cycle control of the memory controller 12.

In more detail, the controller block 22 is responsible for managing the memory array according to the functional specification of the memory. That is, it determines the command sequence on a cycle by cycle basis, based on the state of the current memory and the read/write requests that the user is generating. It aligns write data appropriately with write commands and buffers read data if necessary. It also generates appropriate refresh commands, either transparently to the user or under user control. The controller block 22 is also responsible for initializing the DRAM-type memory.

The PHY block 20 is responsible for handling all the high-speed timing aspects of the interface, including the PVT (process, voltage, temperature)-related issues that significantly affect performance.

The memory controller 12 itself is designed to operate from only one clock but the PHY block 20 handles all the other clocks that are required and the logic that uses them.

The memory controller 12 has a first interface 24, for connection to an external memory device, a second interface 26, for connection to the bus 14, and a third interface 28, for connection to a JTAG interface 30 of the device 10.

In use of the device, a high data rate external memory device, such as a DDR (or DDR2, or DDR3) SDRAM (double-data-rate synchronous dynamic random access memory), 32 can be connected to the first interface 24 of the memory controller 12. One of the advantages of such memory devices is the rate at which data can be read into and out of the memory. However, this leads to a situation where the data rate becomes close to the maximum that can be achieved by the device. Although the signals being transferred across the first interface 24 between the memory controller 12 and the external memory device 32 are of course digital signals, the transition time between "high" level signals and "low" level signals becomes a significant fraction of the clock period, and the interface becomes, in effect, not purely digital. Jitter, inter-symbol interference, and simultaneous switching noise have similar effects on the operation of the interface. This makes it more difficult to test the operation of the memory sub-system, comprising the memory controller 12, the interface 24, and the external memory device 32.

Further, in use of the device, a user computer, such as a PC 34, can be connected to the JTAG interface 30 of the device 10.

The memory controller further comprises a microcontroller, or processor (µP), 36 at the heart of the PHY block 20. In operation of the device, the processor 36 performs various calibration processes, in order to ensure as far as possible that the operations of the memory controller 12 and the external memory device 32 are synchronized. As is conventional, the microcontroller 36 includes some associated memory 38, for example for storing data that it is working on.

In order to implement the memory controller of the invention, the processor 36 is also provided with additional testing functionality. For example, when the functionality of the device 10 is being implemented using software, that software can ask the user to specify whether this additional testing functionality is required. If so, the memory 38 associated with the processor 36 can be increased in size in order to store additional information as described below, and additional logic is provided in order to give this testing functionality.

If the user decides to implement the additional testing functionality, the additional testing can be performed in use of the system. For example, the testing can be performed automatically when the device 10 is powered up. In that case, after completion of the testing the system will provide the results to the user, for example via a GUI or command line presented on the PC 34. The results may for example be a list of timing margins, as discussed in more detail below, and may also include some recommendations to improve the system performance. No user input would be required other than to ensure that the PHY block was compiled with an appropriate selection of the debug functionality and that the JTAG cable to the interface 30 is plugged in.

The testing can also be performed when a specific problem arises, for example after the system has been powered up and in successful operation for a period of time, and the temperature of the device changes.

Further, the testing can be performed in response to a specific command entered by the user.

Figure 2:
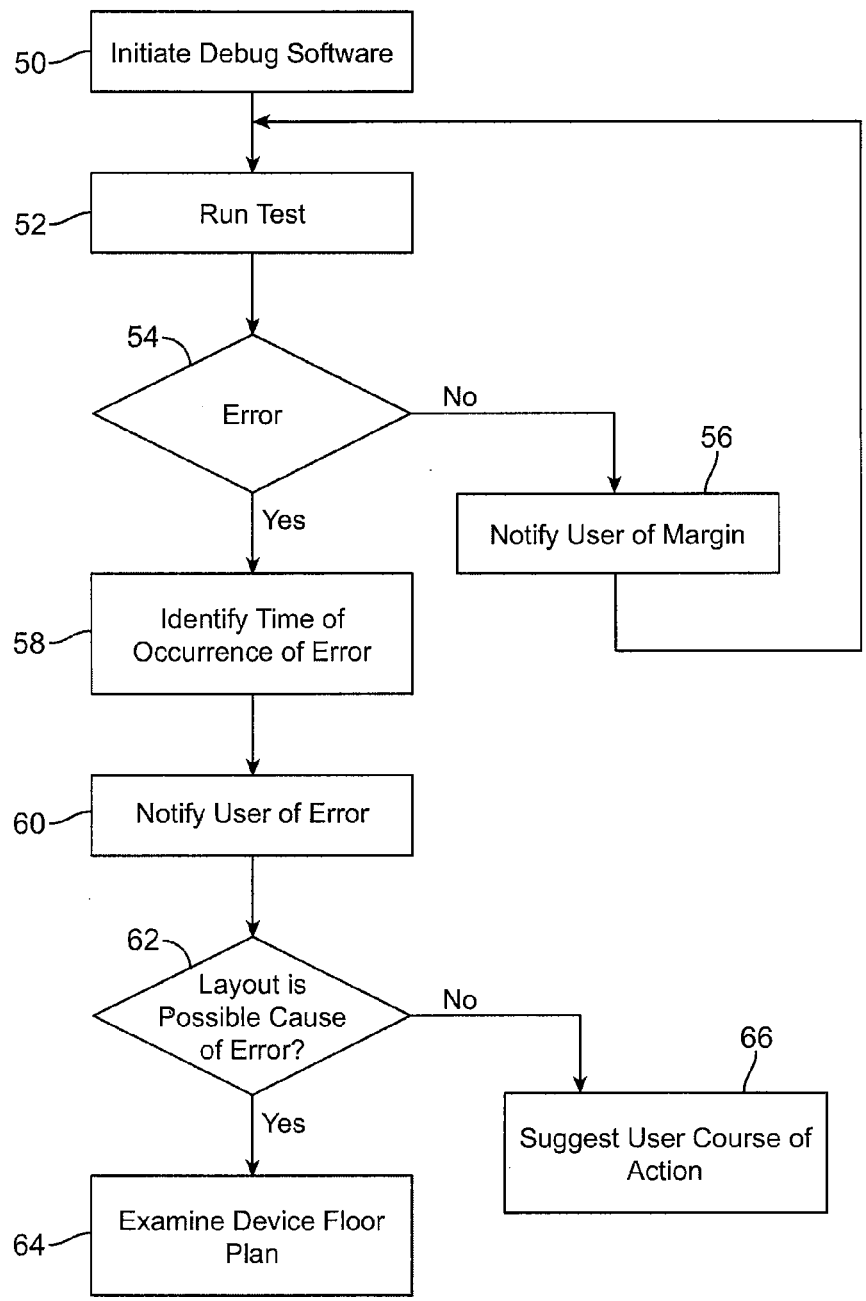
FIG. 2 is a flow chart, illustrating a method in accordance with the present invention.

FIG. 2 is a flow chart, illustrating the operation of the additional testing functionality, in use of the invention.

In the preferred embodiment, the testing process performs a complete test of the operation of the entire memory sub-system, comprising the memory controller 12, the interface 24, and the external memory device 32. It will be appreciated that, in practice, such a test is somewhat extensive, and FIG. 2 therefore shows only certain aspects of the testing for illustrative purposes.

In the illustrative example shown in FIG. 2, the procedure begins at step 50, when the debug software is initiated. As mentioned above, this may happen automatically when the device 10 is powered up or when a problem has arisen, or may be initiated by the user.

In step 52, one test procedure is run. It will be appreciated that the testing of the operation of the entire memory sub-system can be broken down into many individual test procedures, and that FIG. 2 illustrates only one such procedure. For example, the test procedure may involve testing the transmission and/or receipt of data over one pin of the interface 24. Of course, a test procedure testing one pin of the interface 24 can be run in parallel with test procedures testing the other pins of the interface 24.

The test procedure of step 52 can be run while other functions of the device 10 are also operating. This means that any problems of the memory sub-system, that arise only when particular operating conditions of the device 10 apply, are more likely to be detected, and hence are more likely to be resolvable.

In step 54, when the test procedure is completed, or during the test procedure, it is determined whether an error has arisen. If no error has arisen, the process passes to step 56. In such a situation, although no error has arisen, the software can for example notify the user of this, via the JTAG interface 30 and software running on the PC 34. In addition, the software can notify the user of the margin, by which an error was avoided. For example, where the timing of signals is an issue, the software may be able to report that any alteration to the system, which would slow down the transmission of signals from the PHY block 20 to the interface 24 by even a few picoseconds, would lead to an error.

In making such a determination, and elsewhere in the test procedure, the software can take advantage of data obtained previously, during calibration of the device. In this respect, it is advantageous that the software runs on the same processor that also runs the calibration.

For example, a system of this type is particularly sensitive to timing errors, in which data signals do not appear on the interface at the correct times. One aspect of such errors arises because the time taken for a signal to transition from a high level to a low level, or vice versa, is a significant proportion of the bit period. When there is also a timing differential, that is signals that are intended to arrive at pins on the interface 24 in fact arrive at slightly different times, this can cause errors. In order to be able to detect, and hence be able to correct for, such timing errors, it is necessary to know the expected timing margins, that is the size of a timing differential that will not cause an error, because it will still allow the intended signal to be correctly detected within the intended bit period.

Thus, when the system is powered up, or at any later time, the timing margins can be determined and can then be stored, either in memory on the FPGA 10 or in the PC 34. At some later point in time, for example either when it is determined in step 54 that no error has occurred and the process passes to step 56, updated timing margins would be obtained, and these could be passed to the user. The differences between these two sets of data is itself useful debug data for the user. Further, either the host PC 34 or the processor 36 within the PHY 20 of the FPGA 10 can make a judgment about this change in timing (most likely taking into account the elapsed time over which the change occurred) and can either (i) make further adjustments to settings within the PHY 20 and/or (ii) make recommendations to the user (via the host PC 34) about how to more accurately fine-tune the settings for the PHY.

A further advantage of running the software on the processor 36 is that, compared with an alternative system in which a logic analyzer is provided specifically for testing purposes, the testing procedure has minimal impact on the signals actually flowing within the device. Thus, the processor 36 that is used to control all other aspects of the operation of the PHY 20 is also used to perform the testing described here, with the additional testing routines stored in the memory 38 associated with the processor 36. As a result, there is no need to change the logic in the system design, and hence there is no impact on the datapath of the PHY itself, even when extra software routines are added.

If it is determined in step 54 that the test procedure has identified an error in the operation of the memory sub-system, the process passes to step 58. In step 58, the exact time at which the error occurred is noted.

The process then passes to step 60, in which the user is notified by the software of the error that has occurred. As mentioned above, this notification takes place via the JTAG interface 30 and software running on the PC 34. In some cases, the software may immediately be able to notify the user of the nature of the problem. For example, it may be apparent that there is a fault in a component of the hardware. In other cases, the nature of the problem may not be immediately apparent. In such situations, the software may be able to initiate other test procedures to determine the nature of the problem, or may notify the user of possible causes of the error.

In particular, the software may notify the user of the time, noted in step 58 above, at which the error occurred. This information is particularly useful where an error is intermittent, for example because it results from an interaction between the memory sub-system and another application running on the device. In such a situation, the user may be able to determine, from the times at which particular errors occur, which other application is causing the fault in the memory sub-system.

It will be apparent that, at this stage, the software can perform various other tests, and can examine various possible causes of the error. However, in the illustrated case in FIG. 2, step 62 shows the situation where the software determines whether the layout of the device is a possible cause of the error.

Where the error is caused by a timing differential between signals reaching respective pins of the interface 24, this may have been caused by the layout of the device, in that the physical distances on the device to those pins are different. If it is determined in step 62 that the layout of the device is a possible cause of the error, the process can pass to step 64, in which the software can itself access the floor plan, illustrating the physical layout, of the device, and can determine further whether the layout of the device remains a possible cause of the error.

If it is determined in step 62 that the layout of the device is not a possible cause of the error, then other possible causes can be investigated. For example, the process can pass to step 66, in which the software can suggest to the user, via the JTAG interface 30 and software running on the PC 34, some possible course of action. For example, the software can suggest to the user a possible course of action that may resolve the problem. Alternatively, the software can suggest to the user a possible course of action that may reveal more about the cause of the error.

For example, one source of error in such devices is variations in the operating temperature. That is, the device may only operate successfully within a certain temperature range. One possibility in step 66, therefore, is for the software to suggest to the user that he alters the temperature of the device, for example by blowing warm air over it, or by blowing cold air over it. The testing can then be resumed and, if this affects the results of the testing procedure, it can be used to diagnose the fault.

There are therefore provided a method, and a system, for testing the operation of an external interface of a device. The method and system are particularly efficient, in terms of resources employed within the device, and in terms of the time required for the user to implement the system, and then to carry out the required testing operation.

The invention has been described herein with reference to the testing of an external memory interface. However, the invention is equally applicable to other interfaces, and is particularly useful in testing high-speed interfaces that are not purely digital.

Similarly, although the invention has been described herein with reference to its implementation in an FPGA, the invention is equally applicable to other types of device, and could for example be implemented in a memory controller implemented in an ASIC.

What is claimed is:

1. A memory controller comprising:
a first interface coupled to an external memory device;
a second interface coupled to an external user device; and
a processor operable to:
test the first interface, said test comprising measuring:
a timing differential characteristic of the external memory device and the first interface, and
a timing margin by which a timing error is avoided during the test in response to a determination that the error has not yet occurred during the test;
access stored data describing a physical layout of at least one device in response to an error received during said test and after said measuring of the timing margin, wherein the physical layout of the at least one device includes a physical layout of the memory controller,
determine, based on the accessed stored data, and without user input, whether the physical layout of the at least one device caused the error, and
provide a result of said test to the external user device via the second interface.

2. The memory controller of claim 1, further comprising an internal memory for storing instructions comprising software to be executed by the processor to produce the result of said test.

3. The memory controller of claim 2, wherein said software is initiated automatically on powering up.

4. The memory controller of claim 2, wherein said software is initiated automatically in response to detection of an operational problem.

5. The memory controller of claim 2, wherein said software is initiated in response to a user input.

6. The memory controller of claim 1, wherein the second interface is a JTAG interface.

7. The memory controller of claim 1, wherein the processor is further operable to perform a calibration process to synchronize operations of the memory controller and the external memory device.

8. The method of claim 1, wherein the processor is further operable to measure the timing margin based, at least in part, on data obtained from a previous calibration of the memory controller.

9. The method of claim 1, wherein the processor is further operable to test the first interface while the memory controller executes a function unrelated to the test.

10. A computer-readable product comprising a non-transitory machine readable medium on which is provided data for causing a programmable logic device to implement a memory controller method, the method comprising:
coupling a first interface with an external memory device;
coupling a second interface with an external user device;
testing the first interface for compatibility with the external memory device, said testing comprising measuring:
a timing differential characteristic of the external memory device and the first interface, and
a timing margin by which a timing error is avoided during the testing in response to a determination that the error has not yet occurred during the testing;
accessing stored data describing a physical layout of at least a portion of the programmable logic device in response to an error received during said testing and after said measuring of the timing margin;

determining, based on the accessed stored data, and without user input, whether the physical layout of the at least a portion of the programmable logic device caused the error; and providing a result of the testing to the external user device via the second interface.

11. An electronic device comprising:

an interface controller comprising:

a first interface coupled to a device external to the interface controller;

a second interface coupled to an external user device; and a processor, the processor operable to:

test the first interface for compatibility with the device external to the interface controller, said test comprising measuring a timing margin by which a timing error is avoided during the test in response to a determination that the error has not yet occurred during the test, access stored data describing a physical layout of at least one device in response to an error received during said test and after said measuring of the timing margin, wherein the physical layout of the at least one device includes a physical layout of the interface controller, determine, based on the accessed stored data, and without user input, whether the physical layout of the at least one device caused the error, provide a result of said test to the external user device via the second interface, and in response to a determination that the result of said test corresponds to an error event, provide instructions to a user via the external user device.

12. The electronic device of claim 11, wherein the processor is further operable to perform a calibration process to synchronize operations of the interface controller and the external user device.

13. The electronic device of claim 12, wherein said instructions are associated with altering an operating temperature of the electronic device.

14. An electronic device comprising:

an interface controller comprising:

a first interface coupled to a device external to the interface controller;

a second interface coupled to an external user device; and a processor operable to:

test the first interface for compatibility with the device external to the interface controller during intermittent operation of the electronic device, said test comprising measuring a timing margin by which a timing error is avoided during the test in response to a determination that the error has not yet occurred during the test, access stored data describing a physical layout of at least one device in response to an error received during said test and after said measuring of the timing margin, wherein the physical layout of the at least one device includes a physical layout of the interface controller, determine, based on the accessed stored data, and without user input, whether the physical layout of the at least one device caused the error, provide a result of the test to the external user device via the second interface, wherein said result of the test comprises a set of events and a corresponding set of timing margins of the device external to the interface controller and the first interface.

\* \* \* \* \*